United States Patent [19]

Kawasumi et al.

[11] Patent Number: 4,936,940
[45] Date of Patent: Jun. 26, 1990

[54] EQUIPMENT FOR SURFACE TREATMENT

[75] Inventors: Ken-ichi Kawasumi, Ome; Akio Funagoshi, Tachikawa, both of Japan

[73] Assignee: Hitachi, Ltd., Tokyo, Japan

[21] Appl. No.: 428,019

[22] Filed: Oct. 26, 1989

Related U.S. Application Data

[63] Continuation of Ser. No. 211,272, Jun. 24, 1988, abandoned.

[30] Foreign Application Priority Data

Jun. 26, 1987 [JP] Japan ................... 62-157617

[51] Int. Cl.$^5$ .......................................... H01L 21/306
[52] U.S. Cl. ..................... 156/345; 156/643; 156/645; 156/662; 34/36; 34/58; 134/1; 134/31
[58] Field of Search ............... 34/58, 59; 156/36, 643, 156/648, 662; 134/345, 1, 31

[56] References Cited

U.S. PATENT DOCUMENTS 4,637,146 1/1987 Motoki et al. .................. 34/58

FOREIGN PATENT DOCUMENTS 3624384 1/1987 Fed. Rep. of Germany.
223839 10/1986 Japan.

Primary Examiner—Henry A. Bennet
Assistant Examiner—John Sollecito
Attorney, Agent, or Firm—Antonelli, Terry, Stout & Kraus

[57] ABSTRACT

An equipment for surface treatment according to the present invention comprises a chamber capable of exhausting gas, a revolving stage disposed in said chamber for placing a material to be treated thereon, a quartz plate serving as a gap controlling means spaced from the material to be treated such that a gap between said revolving stage and said material to be treated is provided not to exceed 0.5 mm for forming a space of treatment, the quartz plate being provided with a gas supplying means for supplying a reactive gas containing oxygen into the space of treatment, and a gas exciting means provided on the a side of said quartz plate opposite that on which the material to be treated is located for exciting the oxygen contained in said reactive gas into metastable oxygen atoms.

9 Claims, 1 Drawing Sheet

EQUIPMENT FOR SURFACE TREATMENT

This application is a continuation of application Ser. No. 07/211,272, filed June 24, 1988 now abandoned.

BACKGROUND OF THE INVENTION

1. Field of the Invention

The present invention relates to an equipment for surface treatment which is used for treating or modifying a surface of a material to be treated by flowing a reactive gas producing excited and metastable oxygen atoms on decomposition by heat and/or light. Particularly, it relates to equipment for surface treatment by which a flow of reactive gas suitable for removing a layer of a resist or for cleaning a surface can be obtained.

2. Prior Art

In the conventional equipment for removing a resist, as described in Japanese Patent Application Kokai (Laid-Open) No. 223,839/86, ultraviolet lamp is disposed at the distance of 3 to 5 mm from the surface of a wafer in a chamber, and an oxygen gas is caused to flow between the wafer surface and the ultraviolet lamp while maintaining the inner pressure of the chamber at 2 to 3 atmospheric pressures to remove a resist.

The above-mentioned conventional technique is not considered in the aspect that reactive gas layer flowing in the chamber is as thick as 3 to 5 mm so that illuminated light is absorbed as it passes through the thick layer, and it has a problem that metastable oxygen atoms are largely produced far from the surface of the sample to be treated which can not act effectively on the surface of the sample to be treated.

SUMMARY OF THE INVENTION

An object of the present invention is to provide equipment for surface treatment capable of producing metastable oxygen atoms as near to a surface of a material to be treated as possible to enhance the probability that the produced metastable oxygen atoms will hit the surface of the material to be treated and increase the rate of removal of organic materials.

According to the present invention, there is provided equipment for surface treatment which comprises a chamber capable of exhausting gas, a revolving stage disposed in said chamber for supporting a material to be treated thereon, a quartz plate spaced from said material to be treated such that a gap between said quartz plate and said material to be treated is provided not to exceed 0.5 mm for forming a space of treatment, said quartz plate being provided with a gas supplying means for supplying a reactive gas containing oxygen into the space of treatment and a gas exciting means provided on a side of said quartz plate opposite that on which said material to be treated is located for exciting the oxygen contained in said reactive gas into metastable oxygen atoms, the gas supplying means being disposed a predetermined distance away from the axis of revolution of the revolving stage.

That is, according to the present invention a reactive gas producing metastable oxygen atoms through a layer flows within 0.5 mm from the surface of the material to be treated.

Thus, by limiting the thickness of the layer in which the reactive gas flows to 0.5 mm or less, the absorbed amount of the light illuminated in the reaction is decreased and hence a high illuminance can be maintained until the light reaches the surface of the material to be treated. Accordingly, the probability of production of metastable oxygen atoms on the surface of the material to be treated and the probability that the metastable oxygen atoms contact the surface of the material to be treated before the metastable oxygen atoms lose their metastable state by collision with the other gases or atoms are increased, resulting in rapid removal of the organic substances on the surface of the material to be treated.

Even in the case where the metastable oxygen atoms are produced only by heat without illuminating light, the thickness of the layer through which the reactive gas producing the metastable oxygen atoms by heat flows is preferably 0.5 mm or less near the surface of the material to be treated. If the thickness of the layer is larger than that mentioned above, the oxygen atoms can not be effectively excited due to lowered temperature caused by the long distance from the surface of the material to be treated and, besides, the metastable oxygen atoms produced far away repeat collision with the other atoms until they reach the surface of the material to be treated and lose the metastable state thereby.

DESCRIPTION OF THE PREFERRED EMBODIMENT

Figure 1:
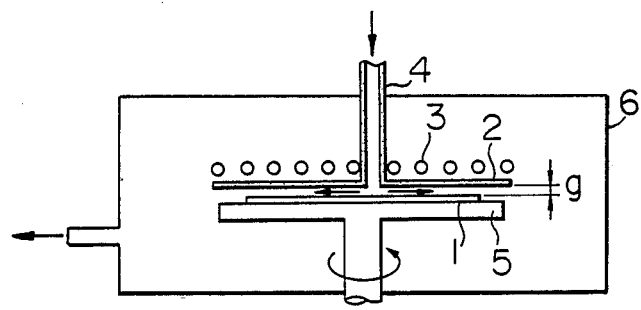
FIG. 1 is an explanatory view showing the main parts of an embodiment of the equipment for surface treatment according to the present invention.
Figure 2:
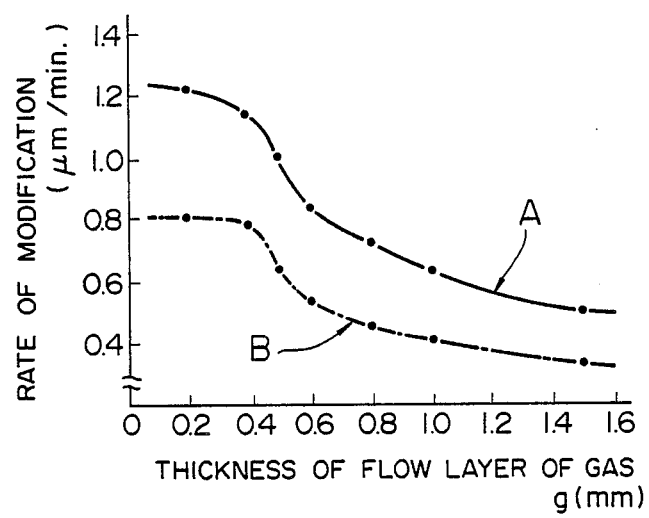
FIG. 2 is a graph showing results of removal of a resist by using the embodiment shown in FIG. 1.

An embodiment of the present invention is illustrated below referring to the drawings. FIG. 1 is an explanatory view showing main parts of an embodiment of the equipment for surface treatment according to the present invention, and FIG. 2 is a graph showing results of removal of a resist by using the embodiment shown in FIG. 1. In FIG. 1, a material to be treated 1 such as a semiconductor wafer coated with a resist on the surface is placed on a revolving stage 5 desirably involving a heater. At the distance of a gap "g" (mm) from the surface of above-mentioned material to be treated, a quartz glass plate 2 which can transmit a desirable light such as ultraviolet rays or infrared rays effectively is disposed. A gas supplying pipe 4 for introducing a reactive gas is penetrated through the quartz glass plate 2 to form a nozzle which is spaced a predetermined distance from the axis of revolution of the revolving stage 5, as shown in FIG. 1. A light source 3 such as, for example, a deep ultraviolet light source or the like or a heat source such as, for example, a heater, is disposed on the side of the quartz plate 2 opposite that on which the material to be treated 1 is located. Each part mentioned above is accommodated in a reaction chamber 6 capable of exhausting gases. A reactive gas introduced into the gas supplying pipe 4 from outside of the reaction chamber 6 is led to the lower portion of the quartz glass plate 2 through the nozzle of the gas supplying pipe 4 and flows almost uniformly on the surface of the material to be treated 1 along the gap "g" formed between the quartz glass 2 and the material to be treated 1 as shown by the arrows in FIG. 1.

As a result of the experiments in which the gap "g" is varied in the equipment for surface treatment having the above-mentioned constitution, in order to remove an organic resist having a thickness of 1 $\mu$m formed on the surface of the material to be treated 1, when the temperature of the material to be treated is kept at 250° C., and a gas containing 5 volume % of ozone as the reactive gas producing metastable oxygen atoms is passed through the gap, at the rate of removing the resist is as shown in FIG. 2. In FIG. 2, curve A is a result in the case of an illuminance of ultraviolet rays, 254 nm, on the surface of the material to be treated of 120 mW/cm$^2$. Curve B shows the rate of removal of resist in the case where the temperature of the material to be treated was 280° C. without illuminating the ultraviolet rays. According to this example, by adjusting the gap "g" through which the reactive gas is passed over the surface of the material to be treated 1 to 0.5 mm or less, there can be obtained a superior effect in enhancement of the rate of removal of the resist.

In the above-mentioned example, there may be used both a light source and a heat source as the gas exciting means. Also, the present invention is not limited in any way by the structure, material and disposition of each main part shown in FIG. 1. Moreover, the reactive gas producing metastable oxygen atoms are not limited to ozone.

As mentioned above, the equipment for surface treatment according to the present invention is equipment for surface treatment for modifying a surface of a material to be treated by flowing a reactive gas which is decomposed by heat, light or both of them and which produces metastable oxygen atoms over the surface of the material to be treated, the equipment including a quartz plate as a gap controlling means for making the thickness of the gap through which the reactive gas is passed to be 0.5 mm or less from the surface of the material to be treated the quartz plate being disposed near the surface of the material to be treated. Thus, such a simple constitution that the thickness of the reactive gas flowing layer on the material to be treated is adjusted to a predetermined value or less enables an increase in the rate of removal of an organic substance or of surface cleaning, resulting in large industrial practical effect such as in the production of semiconductors or cleaning of glass.

What is claimed is:

1. An equipment for surface treatment which comprises a chamber capable of exhausting gas, a revolving stage having an axis of revolution disposed in said chamber for placing a material to be treated thereon, a quartz plate spaced from said material provided on said revolving stage such that a gap between said quartz plate and said material to be treated is provided not to exceed 0.5 mm for forming a space of treatment, said quartz plate being provided with gas supplying means which is spaced a predetermined distance from said axis of revolution of said revolving stage for supplying a reactive gas containing oxygen into the space of treatment, and a gas exciting means provided on a side of said quartz plate opposite the side on which said material to be treated is located for exciting the oxygen contained in said reactive gas into metastable oxygen atoms.

2. An equipment for surface treatment according to claim 1, wherein said gas exciting means is at least one selected from a heat source and a light source.

3. An equipment for surface treatment according to claim 1, wherein said revolving stage involves a heater.

4. An equipment for surface treatment according to claim 1, wherein said reactive gas contains ozone.

5. An equipment for surface treatment according to claim 1, wherein said gas exciting means is an ultraviolet ray source.

6. An equipment for surface treatment which comprises a chamber capable of exhausting gas, a revolving stage having an axis of revolution disposed in said chamber and or placing a material to be treated thereon, a quartz plate spaced from said material to be treated such that a gap between said revolving stage and said material to be treated is provided not to exceed 0.5 mm for forming a space of treatment, said quartz plate being provided with gas supplying means which is spaced a predetermined distance from said axis of revolution of said revolving stage for supplying a reactive gas containing ozone into the space of treatment, and an ultraviolet ray source provided on a side of said quartz plate opposite the side on which said material to be treated is located for exciting said reactive gas.

7. An equipment for surface treatment according to claim 6, wherein said revolving stage involves a heater.

8. An equipment for surface treatment according to claim 2, wherein said gas exciting means is a heat source.

9. An equipment for surface treatment according to claim 2, wherein said gas exciting means is a light source.

* * * * *